(12) United States Patent
Lee et al.

(10) Patent No.: US 9,373,769 B2
(45) Date of Patent: Jun. 21, 2016

(54) SOLAR RECEIVER DESIGN FOR THERMOELECTRIC POWER GENERATION AND WASTE HEAT UTILIZATION

(71) Applicant: Santa Clara University, Santa Clara, CA (US)

(72) Inventors: Hohyun Lee, Santa Clara, CA (US); Claire Kunkle, Olympia, WA (US); Mark F. Wagner, Glendale, CA (US); Rachel Donohoe, Juneau, AK (US)

(73) Assignee: Santa Clara University, Santa Clara, CA (US)

( * ) Notice: Subject to any disclaimer, the term of this patent is extended or adjusted under 35 U.S.C. 154(b) by 0 days.

(21) Appl. No.: 14/509,421

(22) Filed: Oct. 8, 2014

(65) Prior Publication Data

US 2015/0136194 A1   May 21, 2015

Related U.S. Application Data

(60) Provisional application No. 61/904,956, filed on Nov. 15, 2013.

(51) Int. Cl.
*H01L 35/00* (2006.01)
*H01L 35/30* (2006.01)

(52) U.S. Cl.
CPC ...................... *H01L 35/30* (2013.01)

(58) Field of Classification Search
CPC .................. H01L 35/02–35/34; H02S 40/22; F24J 2/00; F21V 29/002–29/90
USPC .................................................. 136/200–242
See application file for complete search history.

(56) References Cited

U.S. PATENT DOCUMENTS

| | | | | |
|---|---|---|---|---|
| 4,734,139 A * | 3/1988 | Shakun | ................... | H01L 35/30 136/205 |
| 6,226,994 B1 * | 5/2001 | Yamada | ................... | F25B 21/02 136/203 |
| 2005/0000559 A1 * | 1/2005 | Horio | ...................... | H01L 35/30 136/205 |
| 2007/0125413 A1 * | 6/2007 | Olsen | ..................... | H01L 35/08 136/205 |
| 2010/0319747 A1 * | 12/2010 | Wong | ..................... | H01L 35/30 136/201 |

* cited by examiner

*Primary Examiner* — Allison Bourke
*Assistant Examiner* — Niki Bakhtiari
(74) *Attorney, Agent, or Firm* — Lumen Patent Firm

(57) ABSTRACT

A solar energy heat to electricity conversion device is provided that includes a thermally conductive solar receiver having a cylinder with an open end and a cup-shape closed end and a thermally conductive fin disposed on an outside surface of the cup-shape closed end, where the thermally conductive solar receiver is capable of absorbing solar energy directed into the cylinder, a thermoelectric module (TEM) that includes a first plate and a second plate, where the first plate is in contact with a surface of the thermally conductive fin, where the conductive fin is capable of transferring heat to the first plate, and a thermally conductive water block in contact with the TEM that is capable of cooling the TEM, where the water block includes a fluid input and a fluid output, where the TEM generates electricity according to a temperature difference between the first plate and the second plate.

3 Claims, 6 Drawing Sheets

SOLAR RECEIVER DESIGN FOR THERMOELECTRIC POWER GENERATION AND WASTE HEAT UTILIZATION

CROSS-REFERENCE TO RELATED APPLICATIONS

This application claims priority from US Provisional Patent Application 61/904,956 filed Nov. 15, 2013, which is incorporated herein by reference.

FIELD OF THE INVENTION

The current invention relates to solar energy conversion. More particularly, the invention relates to a concentrated solar power receiver directed to providing thermal energy for heating and thermoelectric modules.

BACKGROUND OF THE INVENTION

Currently, there are two major techniques to utilize solar energy; photovoltaics (PV) that directly convert light into electricity, and solar thermal energy that heats working fluids to run a turbine or to provide domestic hot water. Although solar thermal energy can generate both electricity and heat, applications have been limited to utility-scale power generation due to expensive parts and high installation costs.

The core of a concentrated solar power (CSP) system is the solar receiver. Current designs for CSP systems are focused on industrial scale operation, leaving residential solar systems to only use of photovoltaic panels. Photovoltaic panels are an inefficient form of solar power because they only utilize a small portion of the solar spectrum and they operate at low conversion efficiencies that are worsened by heat. CSP systems on a residential scale provide thermal energy, which can be used for a variety of purposes including hot water, space heating, and absorption refrigeration.

CSP has historically been the most cost effective method of harnessing solar energy for electricity production on the utility scale; solar energy is reflected using mirrors and concentrated into a receiver to heat a working fluid that runs a turbine. CSP also possesses a distinctive potential for combined cooling, heating, and power (CCHP) generation systems due to the high temperature of rejected heat. Waste heat present after electricity generation can be further extracted for space heating, domestic hot water, and absorption chiller refrigeration. Energy systems with CCHP have a much higher energy conversion efficiency compared to other technologies. Up to 75% of incoming solar radiation can be converted into useful energy including electricity. Despite the benefits of CSP, the cost per energy produced is not currently competitive at the residential scale, since a small mechanical system has a large ratio of parasitic heat loss to power production and high component/installation costs per power output.

Although utility-scale CSP has developed and shown success over the past few decades, small-scale CSP for distributed combined heat and electricity has not developed mainly due to economic challenges. CSP requires a solar tracker, which alone constitutes up to 40% of the installation cost in CSP. Moreover, existing systems generate electricity mostly through the use of turbines, which are inefficient and expensive at the small scale. Turbines also cause noise and require regular maintenance.

Thermoelectric materials directly convert heat into electricity at a solid state, making them reliable, easily scalable, and free of vibration or noise. Thermoelectric systems have been used as the power systems for many deep space missions for more than 30 years. Unlike photovoltaics (PV), their energy conversion efficiency does not degrade with increasing temperature and the entire spectrum of solar energy in the form of heat can be utilized. Thermoelectric modules show higher power to area/weight ratios and generate more power under cloudy conditions than PV cells. The major drawback of this technology is low efficiency.

With currently available materials, energy conversion efficiency is barely 10% under a temperature difference of 200K. Despite low efficiency, thermoelectric materials have the advantage of generating electricity from any temperature difference. Most significantly, they can generate electricity under small temperature differences, where the use of other energy conversion technologies cannot be economically justified. For combined heat and electricity, low conversion efficiency has less adverse effects, since rejected heat can be further extracted for other purposes. At the residential scale, most of electricity-intense appliances are related to heating or cooling, and can be replaced with thermal energy using absorption chillers. Hence, the thermoelectric system is an economically viable solution for the residential scale combined heat and electricity from concentrated solar power. Currently, most research efforts have been focused on the development of highly efficient thermoelectric materials. Consequently applications have only been restricted to niche markets, such as space missions or car seat cooling/heating.

Because of the high installation and fixed costs of existing solar trackers, the U.S. Department of Energy (DOE) has challenged researchers to reduce the installation cost of heliostat fields from $200 per square meter to $70 to lower total capital costs on utility-scale power plants by 25%. High fixed costs exist for conventional heliostats because of the robust steel supports needed for stability. Specifically, the two main cost drivers beside installation in large heliostat fields are the drive motor assemblies and the mirror support/structure/foundation. The installation of this heavy hardware is the other major component of tracker assembly cost and requires an automated assembly and deployment system.

The predominant two-axis tracker design is commonly termed a mast tracker. Mast trackers require a very stout pole, or "mast", to be drilled deep into the ground to support normal loading. The mast height is at least one half of the panel height above the ground so that the tracker can orient toward the sun at low elevation angles. The requisite foundations result in considerable geological concerns for site planning, as well as heavy machinery, contributing to the installation costs. Since existing two-axis trackers control their load from a single central point, the drive assemblies must be very heavy duty and added trusses are often needed to keep the structure from flexing or sagging at the extremes. Several two-axis mast trackers have been designed with reduced installation costs as a motivating factor. The PVT 7.2DX, manufactured by PV Trackers, utilizes a tripod structure for support. The system is compatible with helical piles reducing installation costs by eliminating the need for concrete foundations. The Google RE<C initiative designed a two-axis heliostat, also with a triangular base, and ground securing is accomplished with a single helical pile. Finally, the Opel SF-45 is a utility-grade tracker for use with PV panels. The manufacturer claims it can be installed by a two person team without any field welding. Qbotix has developed a system, which allows an entire array of PV panels to be adjusted discretely by a single robot that runs on a track from panel to panel. While this can effectively cut costs by using a single actuation unit for multiple panels, the discrete nature cannot be used for solar thermal applications. In all cases above, the load is carried atop a tall mast and requires heavier materials to achieve the rigidity necessary to ensure acceptable pointing accuracy.

What is needed is a device that provides heat and electricity to a single-family home from concentrated solar energy using thermoelectric modules.

SUMMARY OF THE INVENTION

To address the needs in the art, a solar energy heat to electricity conversion device is provided that includes a thermally conductive solar receiver having a cylinder with an open end and a cup-shape closed end, where the cup-shape closed end includes a thermally conductive fin disposed on an outside surface of the cup-shape closed end, where the thermally conductive solar receiver is capable of absorbing solar heat energy directed into the cylinder, a thermoelectric module (TEM) that includes a first plate and a second plate, where the first plate is in contact with a surface of the thermally conductive fin, where the conductive fin is capable of transferring heat to the first plate, and a thermally conductive water block, where the water block is in contact with the TEM and is capable of cooling the TEM, where the water block includes a fluid input and a fluid output, and a fluid channel connecting the fluid input and the fluid output, where the TEM is capable of generating electricity according to a temperature difference between the first plate and the second plate.

According to one aspect of the invention, the thermally conductive solar receiver includes silicon carbide.

In another aspect of the invention, the water block includes copper.

According to another aspect, the invention further includes a second TEM and a second water block, where the second TEM first plate is in contact with a second surface of the thermally conductive fin, where the second water block is in contact with the second TEM second plate.

DETAILED DESCRIPTION

The current invention provides a combined thermoelectric and heat system. According to one embodiment, the invention exploits a low-profile economic solar tracker. Concentrated solar thermal energy is firstly converted into electricity using thermoelectric modules, and rejected heat from the thermoelectric system will further be extracted for an absorption chiller, domestic hot water, or space heating.

The invention involves a solar receiver to be attached to a residential scale CSP system. The invention incorporates thermoelectrics to produce electricity as well as waste heat that can be used for many residential applications that use thermal energy.

According to one embodiment, the invention is composed of a silicon carbide solar receiver, two thermoelectric modules (TEMs), a pair of copper water blocks, fluid piping, and a clamp to effectively utilize solar heat for the production of electricity and heating of a thermal fluid.

Figure 1A:
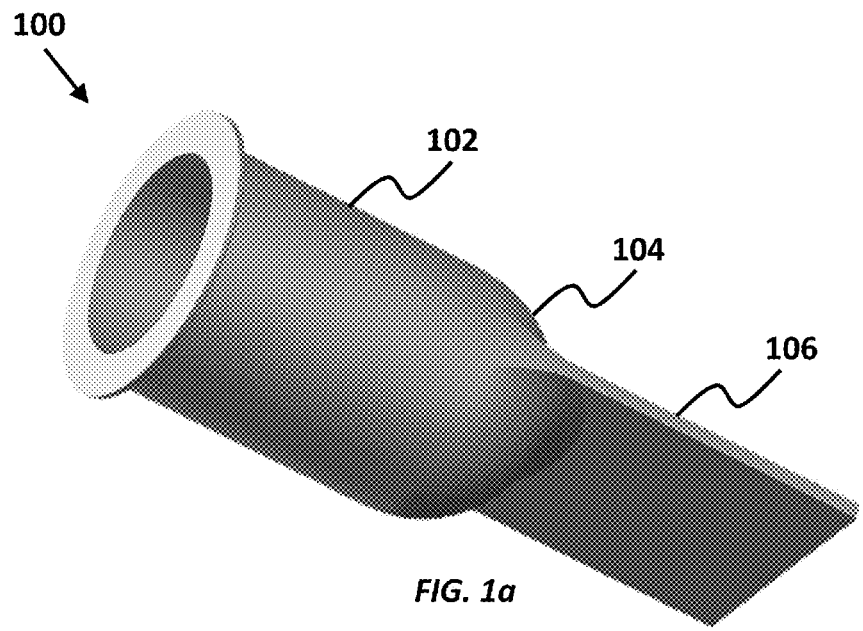
FIGS. 1a-1c show a silicon carbide receiver with a heat transfer fin, according to one embodiment of the invention.
Figure 1B:
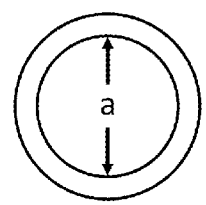
Figure 1C:
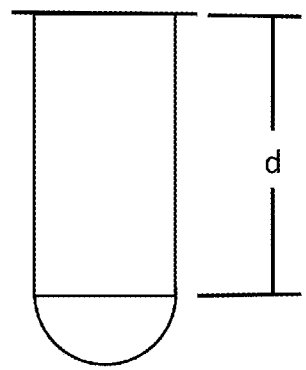

The key component in these is the solar receiver 100 shown in FIG. 1. In this cavity, solar rays are collected and contained. The silicon carbide material for the receiver 100 is particularly successful at absorbing and retaining the heat. This is heightened by the unique geometry of the receiver, designed to optimize blackbody performance. According to one embodiment, the receiver includes a cylindrical housing 102 with an open end and a cup-shape closed end 104, where the cup-shape closed end 104 includes a thermally conductive fin 106 disposed on an outside surface of the cup-shape closed end 104. According to one embodiment, the receiver 100 has a depth to diameter aspect ratio of 2:1.

The receiver 100 can reach temperatures of up to 800° C., when no heat is extracted for power generation or heating. The addition of a fin 106 for the receiver shown in FIG. 1 is a necessary element for the receiver 100 to effectively transfer heat to thermoelectrics that are attached to each side of the fin 106.

Figure 2:
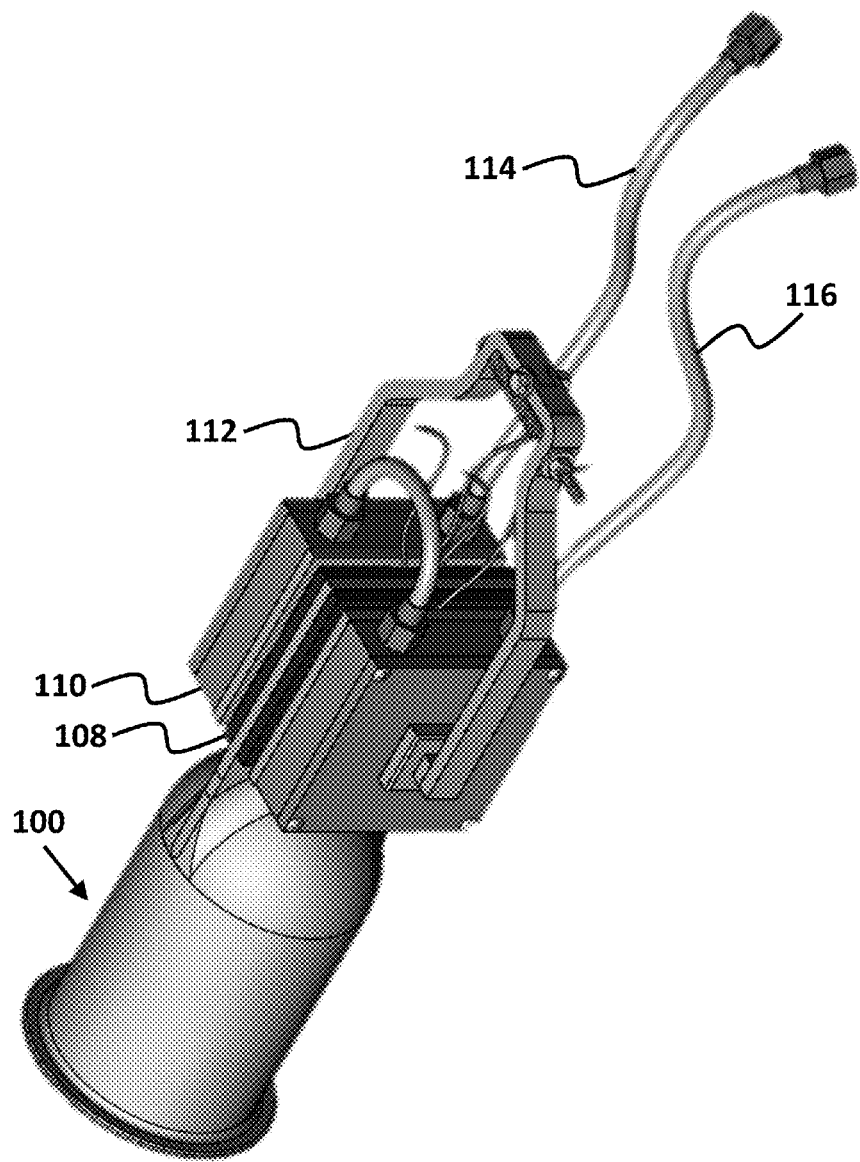
FIG. 2 shows a receiver device with TEMs, water blocks, clamp, and fluid piping, according to one embodiment of the invention.
Figure 3A:
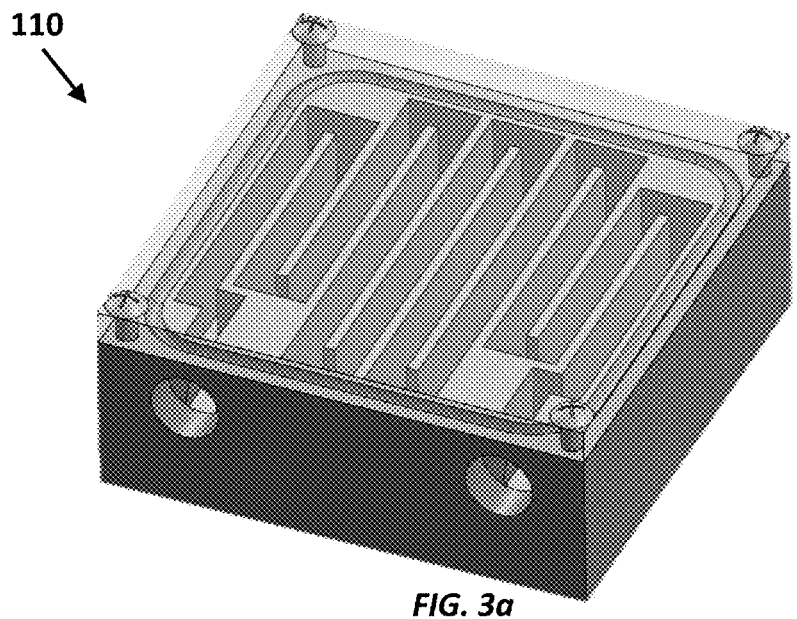
FIGS. 3a-3b shows copper water blocks for thermal fluid heating and TEM cooling, according to one embodiment of the invention.
Figure 3B:
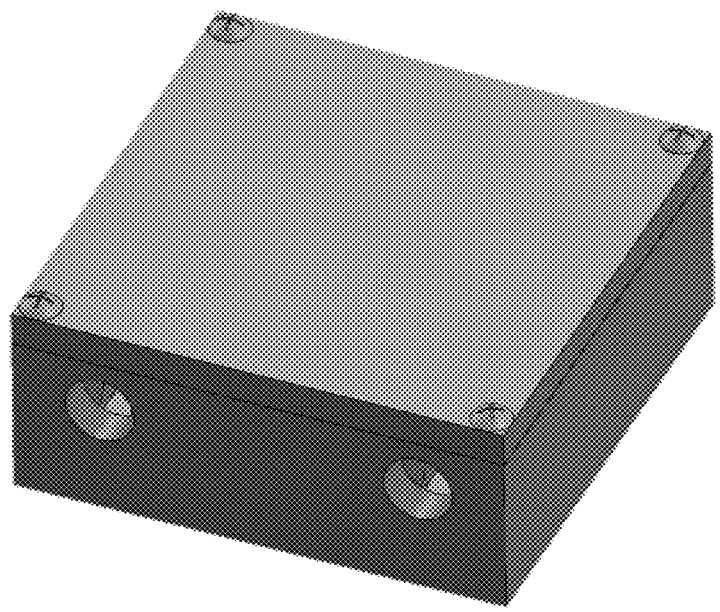

According to the current invention, FIG. 2 shows thermoelectric modules (TEMs), which produce electricity due to the Seebeck effect, where the temperature difference from one side of the module to the other produces a voltage that is proportional to the temperature difference. To maximize temperature gradient and their voltage output, the TEMs 108 are placed on both sides of the receiver fin 106, with their respective hot sides placed flat against the fin 106. The high contact surface area achieved by the use of a fin 106 increases the performance of the TEMs 108. On the outer-facing cold sides of the TEMs 108, two custom designed copper water blocks 110 are placed in contact, as shown in FIG. 2.

When a thermal fluid is flowing through these blocks 110, they will assist in cooling the cold side of the TEM 108. This increases the temperature differential across the TEM plates, and thus the performance of the TEM 108 and heats the thermal fluid. The waste heat for the system will not be lost but will instead go from the TEM 108 to the thermal fluid. According to one embodiment, this arrangement can be disposed on to the fin 102 of the silicon carbide receiver using a clamping device 112 as shown in FIG. 2.

The clamping mechanism 112 shown in FIG. 2 is beneficial because it provides pressure to assist in surface contact between all parts of the system. Additionally, the clamp 112 connects the two TEM 108 cold sides, whereas designs with single thermoelectric clamps require a contact between the cold side and the hot receiver, which leads to unwanted heat transfer and an increase in the cold side temperature, and decrease in the TEM performance.

Figure 4:
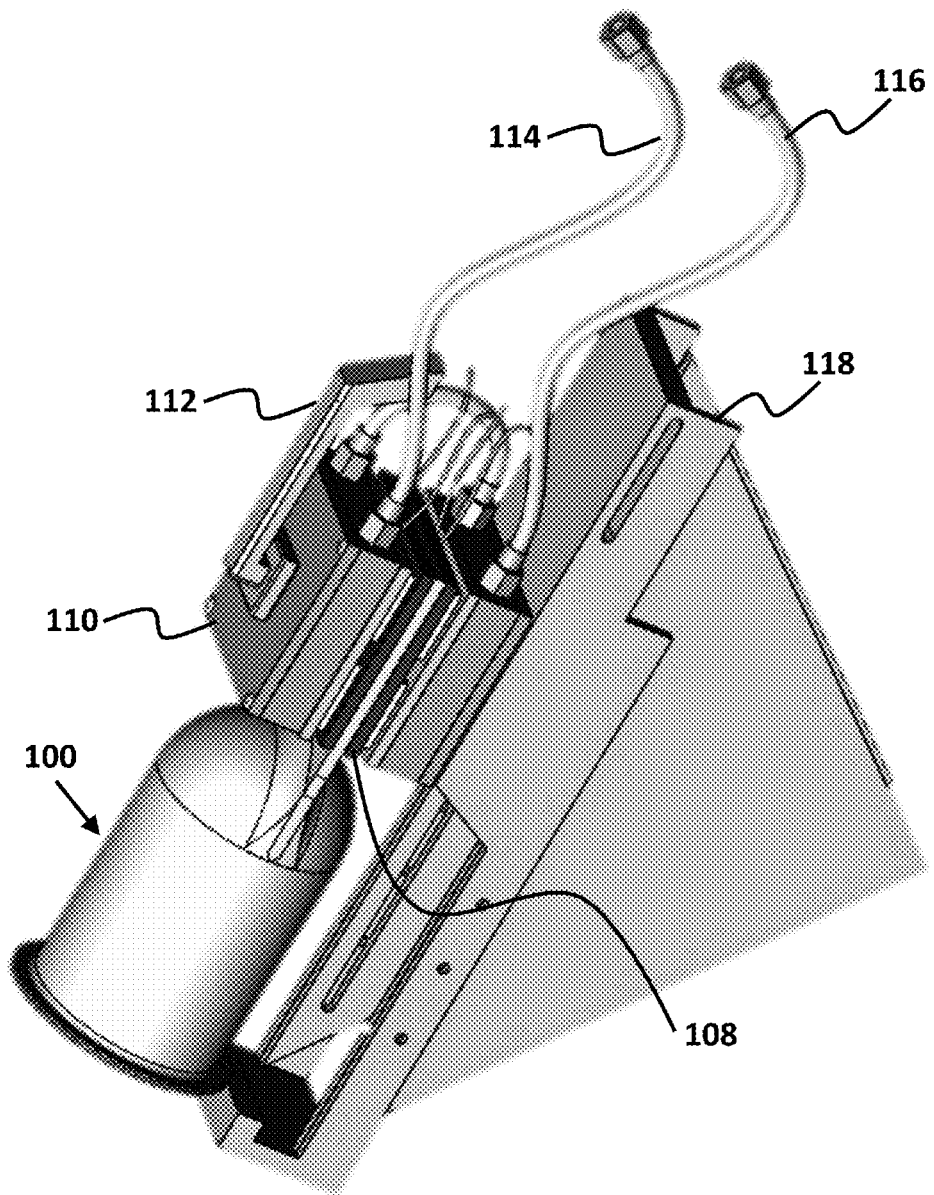
FIG. 4 shows a full body clamping mechanism included in an arm attachment, according to one embodiment of the invention.

The clamping mechanism 112 could have variations to accomplish different racking assemblies. The clamp could be done as shown in FIG. 2 or it could be part of a fuller stand 118 that attaches to the concentrated solar system. These adjustments can be made based on the application or size of the system. One example is shown in FIG. 4.

Also shown in FIG. 2 are the inlet hose 114 and outlet hose 116 for the thermal fluid. These can be attached to various external systems to provide heat. Possible applications include hot water heating, where a closed loop circulation of thermal fluid could act as assistance to the traditional hot water heater, reducing the need for gas or electric heating.

Additionally, a thermal fluid could circulate in the floor or walls of a house to provide space heating; often called radiant heating. Thermal fluid could also be the heat provided to run a gas absorption refrigerator. Certain retrofits would be necessary on the refrigerator unit, but the heat provided from a thermal fluid could provide the energy to run such a refrigerator.

Different embodiments of the invention, with the addition of a fin, provide significant advantages over the afformentioned designs. First, water blocks 110 can be readily exchanged or fixed if issues arise. Second, this design allows for the incorporation of TEMs 108, where in previous devices, TEMs 108 are not be able to achieve ideal surface contact. In the current invention, the fin 106 creates the ideal flat surface for maximum contact and heat transfer. The addition of TEMs 108 create a source of electricity which adds to a system that would only provide thermal energy without TEMs 108.

The current invention uses rejected heat for applications that can include air conditioning, space heating, and domestic hot water, which makes up more than 50% of the energy is consumed in a single-family home. Typical refrigerators or air conditioners operate under a vapor compression cycle, which uses ecologically destructive working fluids, such as Freon gas. Most of the electricity is consumed in the compressors of these refrigerators, which cause noise and vibration that leads to an uncomfortable living environment. An absorption chiller refrigerator replaces a mechanical compression cycle with a thermal compression cycle, which can be powered using rejected heat from the current invention. During winter, the rejected heat can also be used for space heating or domestic hot water, which could also reduce natural gas consumption. The current invention provides a reliable absorption chiller system powered by solar thermal energy. The operation temperature of an absorption chiller is usually much higher than the temperatures of typical solar collectors. Therefore, it usually requires concentrated solar collectors. Since the rejected heat of the current invention is at a higher temperature than other solar collectors, the current invention provides energy to an absorption chiller system as well as energy for space heating or domestic hot water.

Figure 5:
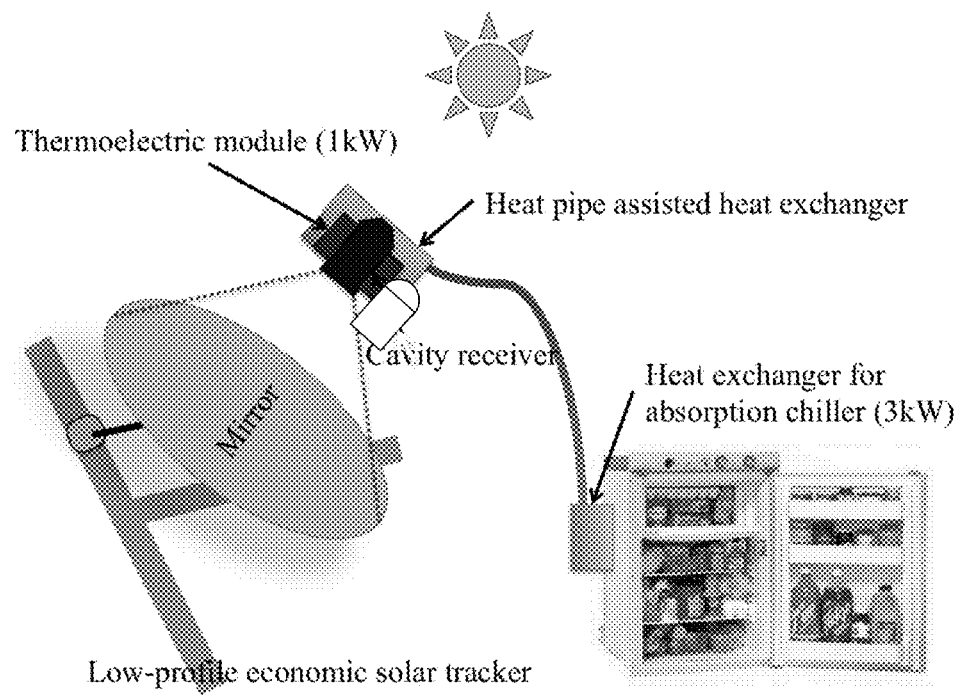
FIG. 5 shows a schematic drawing of one implementation of one embodiment of the current invention.

An operation schematic of one embodiment of the current invention is shown in FIG. 5. The solar energy is reflected onto a concave dish mirror and concentrated into a ceramic receiver. The mirror and the receiver will sit on the low-profile tracker. Thermoelectric modules are attached to the surface of the receiver and generate 1 kW of electricity. In order to achieve high efficiency, the other sides of the thermoelectric modules are cooled down using heat pipes. The rejected heat is further extracted by a working fluid that transfers heat from the cold side of the modules to an absorption chiller. The working fluid dissipates the heat into the boiler column of the absorption chiller, which initiates the refrigeration cycle.

A heat source at higher temperatures is desirable for larger amounts of electrical power and higher energy conversion efficiency with TEMs. However, high operation temperature also has a disadvantage of large heat loss to the ambient by radiation. Hence, it is necessary to find an optimum working temperatures and size of reflectors to assist the energy production for a single-family home. A target energy production from the system in the range of 1 kW of electricity and 9 kW of heat is possible, according to one embodiment of the invention, where the electricity-intense appliances, such as refrigerators or air conditioners, can be powered by thermal energy.

Figure 6:
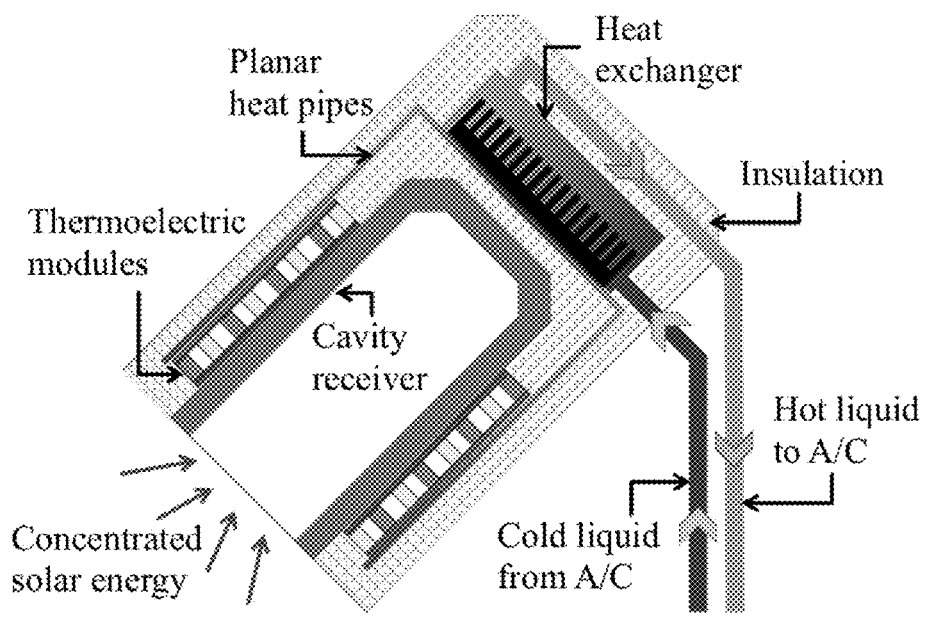
FIG. 6 shows a schematic view of cavity absorber integrated with thermoelectric modules, heat pipes, and heat exchangers, according to one embodiment of the invention.

According to a further embodiment, FIG. 6 shows eight thermoelectric modules integrated on the surface of the receiver and connected in series. Each TEM is capable of generating 12.5 W at 5V under temperature difference of 200K. In order for thermal resistance of heat dissipation to be as low as possible, electric power should be collected at half of the open circuit voltage. Low heat sink thermal resistance is necessary to achieve larger temperature differences, and the electric load is chosen to minimize parasitic power loss by Joule heating. One should note that the condition for half of the open circuit voltage is a function of not only internal impedance of a TEM but also heat sink thermal resistances. A power management circuit can be integrated to the system to address this issue. In the current embodiment of the invention, micro-flat heat transmitter heat pipes are utilized to minimize the thermal resistance at the cold side of a TEM. Heat dissipation by phase change ensures effective heat removal from the TEM and therefore large temperature difference across the TEM. Moreover, the use of heat pipes enables easier implementation of heat exchangers that provides energy into an absorption chiller. FIG. 6 shows how TEMs, heat pipes, and heat exchangers are integrated into a solar receiver.

The present invention has now been described in accordance with several exemplary embodiments, which are intended to be illustrative in all aspects, rather than restrictive. Thus, the present invention is capable of many variations in detailed implementation, which may be derived from the description contained herein by a person of ordinary skill in the art. For example rectangular cavity receiver can be devised to hold four thermoelectric modules instead of two. Thermoelectric module geometry can be modified to generate higher voltage but maintain the same level of power.

All such variations are considered to be within the scope and spirit of the present invention as defined by the following claims and their legal equivalents.

What is claimed:

1. A solar energy heat to electricity conversion device comprising:
 a. concave dish mirror;
 b. a thermally conductive silicon carbide solar blackbody receiver, wherein said silicon carbide solar blackbody receiver comprises a silicon carbide cylinder having an open end and a cup-shape closed end that is configured to absorb solar radiation and retain heat therein, wherein said silicon carbide cylinder comprises a depth to diameter aspect ratio of 2:1 that spans from said open end to a beginning of said silicon carbide cup-shape closed end, wherein said silicon carbide cup-shape closed end comprises a silicon carbide thermally conductive fin disposed on an outside surface of said silicon carbide cup-shape closed end, wherein said silicon carbide thermally conductive fin extends from a base of said silicon carbide cup-shape closed end in a direction that is parallel to a longitudinal axis of said silicon carbide cylinder, wherein said thermally conductive silicon carbide solar blackbody receiver is configured to oppose said concave dish mirror and to absorb solar heat energy directed into said silicon carbide cylinder from said opposing concave dish mirror;
 c. a first thermoelectric module (TEM) wherein said TEM comprises a first plate and a second plate, wherein said first plate of said first TEM is in contact with a first surface of said thermally conductive fin, wherein said silicon carbide thermally conductive fin is capable of transferring heat to said first plate of each said TEM; and
 d. a thermally conductive water block, wherein said thermally conductive water block is in contact with said first TEM and is capable of cooling said first TEM, wherein said thermally conductive water block comprises a fluid input and a fluid output wherein said water block comprises a fluid channel connecting said fluid input and said fluid output wherein said first TEM is capable of generating electricity according to a temperature difference between said first plate and said second plate.

2. The solar energy heat to electricity conversion device of claim 1, wherein said water block comprises copper.

3. The solar energy heat to electricity conversion device of claim 1 further comprises a second TEM comprising a first plate and a second plate and a second thermally conductive water block, wherein said second TEM first plate is in contact with a second surface of said thermally conductive fin, wherein said second thermally conductive water block is in contact with said second TEM second plate.

* * * * *